(12) United States Patent
Katayama

(10) Patent No.: US 7,956,348 B2
(45) Date of Patent: Jun. 7, 2011

(54) COMPLEMENTARY LOGIC CIRCUIT

(75) Inventor: Yasunao Katayama, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 552 days.

(21) Appl. No.: 11/569,855

(22) PCT Filed: May 26, 2005

(86) PCT No.: PCT/JP2005/009693
§ 371 (c)(1),
(2), (4) Date: Oct. 14, 2008

(87) PCT Pub. No.: WO2005/117127
PCT Pub. Date: Dec. 8, 2005

(65) Prior Publication Data
US 2009/0051384 A1   Feb. 26, 2009

(30) Foreign Application Priority Data
May 31, 2004   (JP) .................................. 2004-162425

(51) Int. Cl.
*H01L 29/06* (2006.01)
(52) U.S. Cl. ................ 257/23; 257/14; 257/25; 257/39; 257/E29.316; 257/E29.245; 977/762; 977/774
(58) Field of Classification Search ................ 257/9, 12, 257/14, 17, 23, 25, 30, 31, 36, 104–106, 257/E29.07, E29.071, E29.072, E29.316; 977/701, 712, 720, 755, 759, 932, 933, 940
See application file for complete search history.

(56) References Cited

U.S. PATENT DOCUMENTS

| | | | |
|---|---|---|---|
| 5,401,981 A * | 3/1995 | Michael et al. | 257/30 |
| 2002/0121636 A1* | 9/2002 | Amin et al. | 257/9 |
| 2005/0157996 A1* | 7/2005 | McCarthy et al. | 385/123 |
| 2005/0235027 A1* | 10/2005 | Jung et al. | 708/630 |

FOREIGN PATENT DOCUMENTS

JP   07-083111 B2   9/1995

OTHER PUBLICATIONS

Merlari Nano, "Technology Roadmap for Nanoelectronics", European Commission IST programme Future and Emerging Technologies, Microelectronics Advanced Research Initiative, pp. 1-81.
J.S. Moon, J.A. Simmons, M.A. Blount, W.E. Baca, J.L. Reno and M.J. Hafich, Gate-controlled double electron layer tunneling transistor and single transistor digital logic applications, Electronic Letters, vol. 34, No. 9 (1998).

* cited by examiner

*Primary Examiner* — Evan Pert
*Assistant Examiner* — Scott Wilson
(74) *Attorney, Agent, or Firm* — Ido Tuchman; William J. Stock

(57) ABSTRACT

A quantum device comprises first conductive members and second conductive members confining carriers in the z direction and having two dimensional electron gas on the xy plane. Third conductive members generating an electric field having an effect on the first conductive members. An insulating member easily passing a tunnel current between the first conductive members and the second conductive members. Another insulating member hardly passing a tunnel current between the first conductive members and the third conductive members. An electric field generated by a potential applied to the third conductive members has an effect on the sub-band of the first conductive members.

26 Claims, 11 Drawing Sheets

[Figure 1]
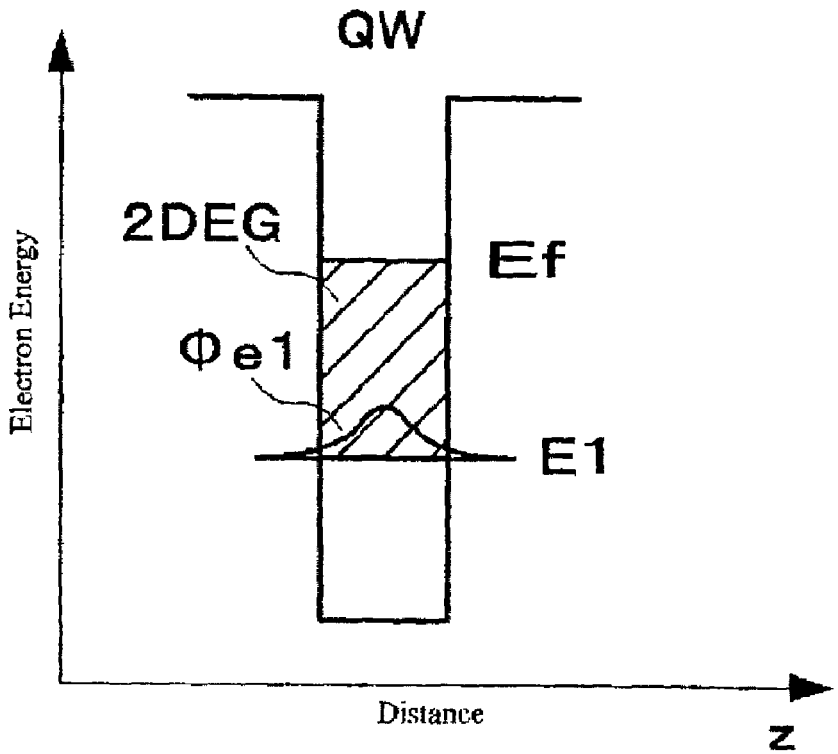
[Figure 2]
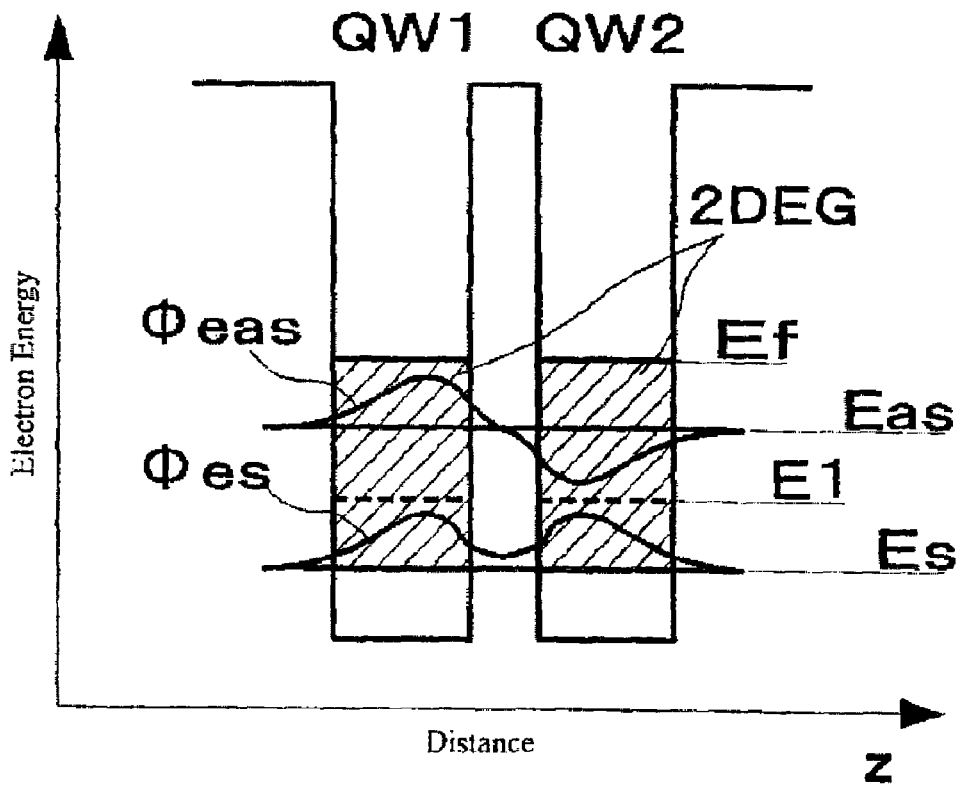

[Figure 3]
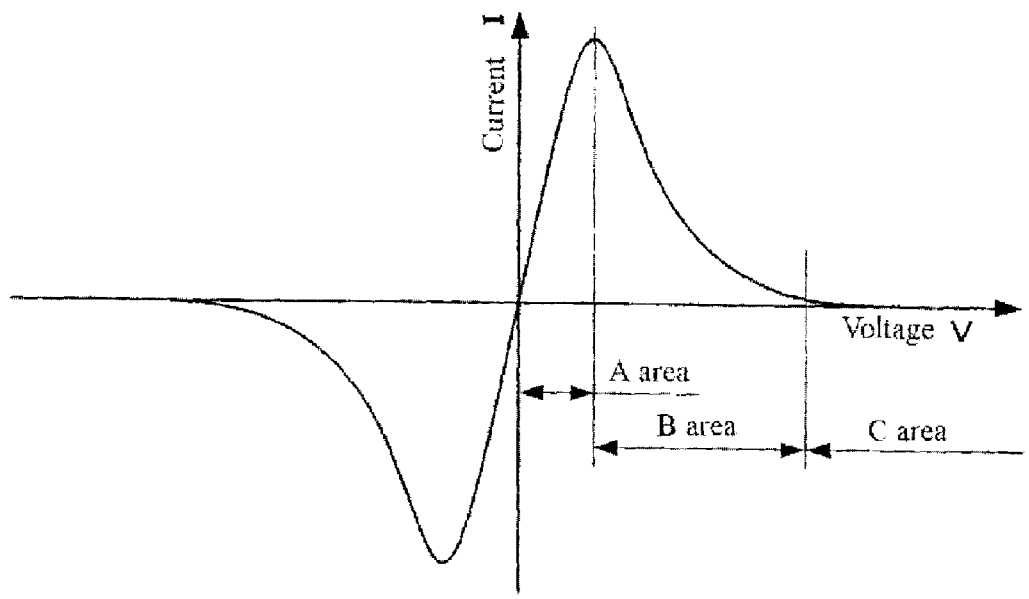
[Figure 4]
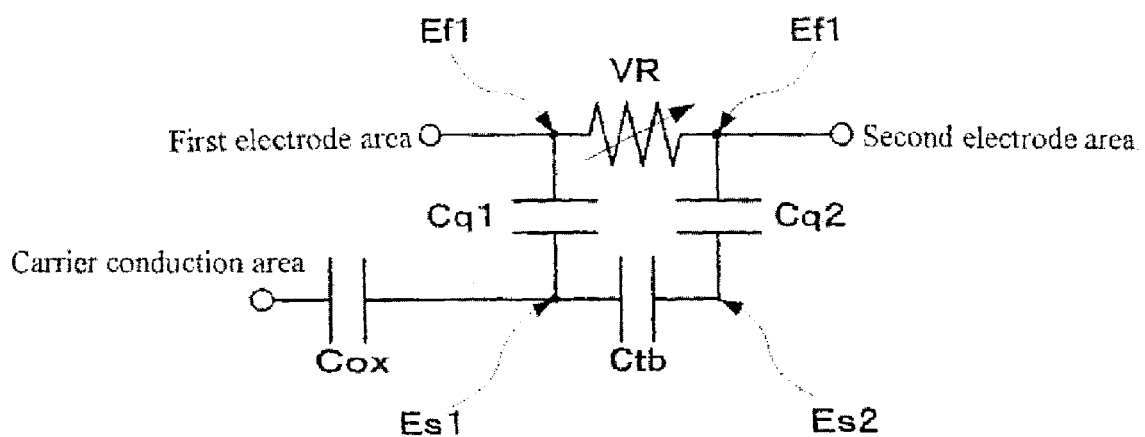

[Figure 5]
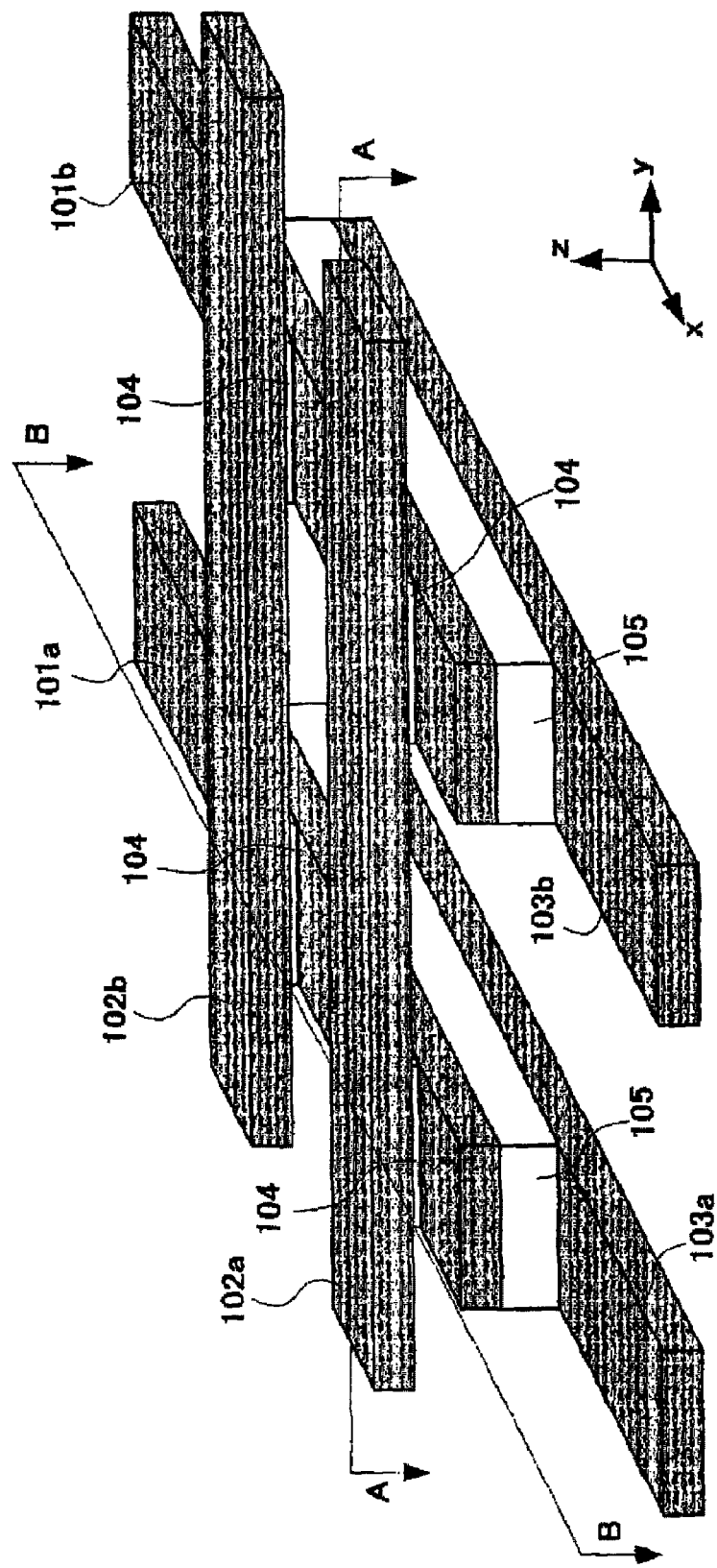

[Figure 6]
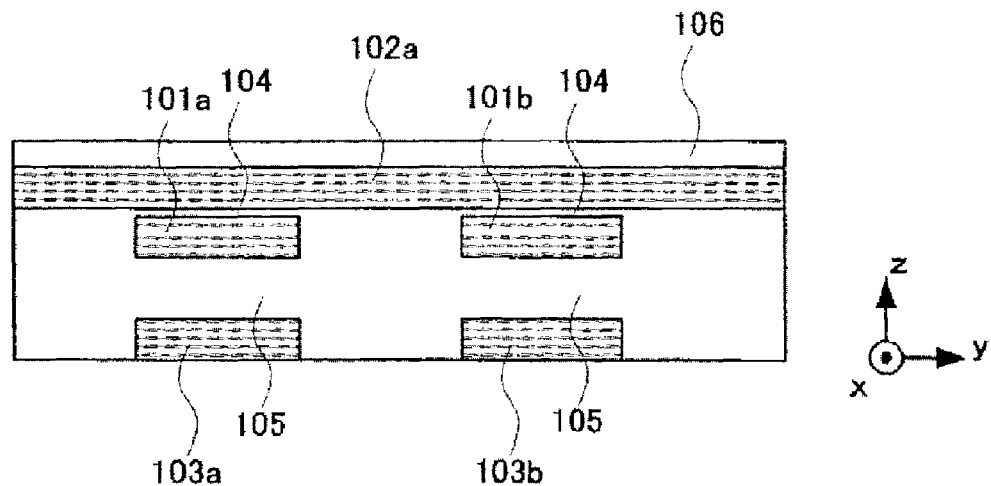
[Figure 7]
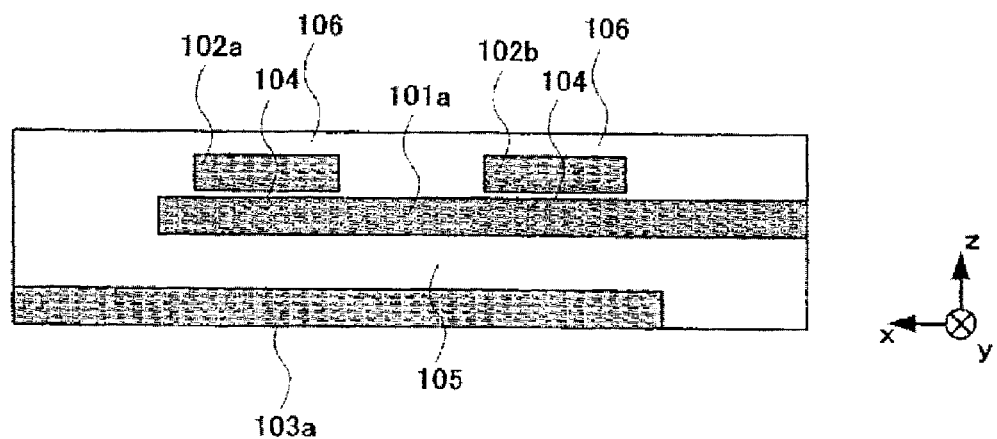

[Figure 8]
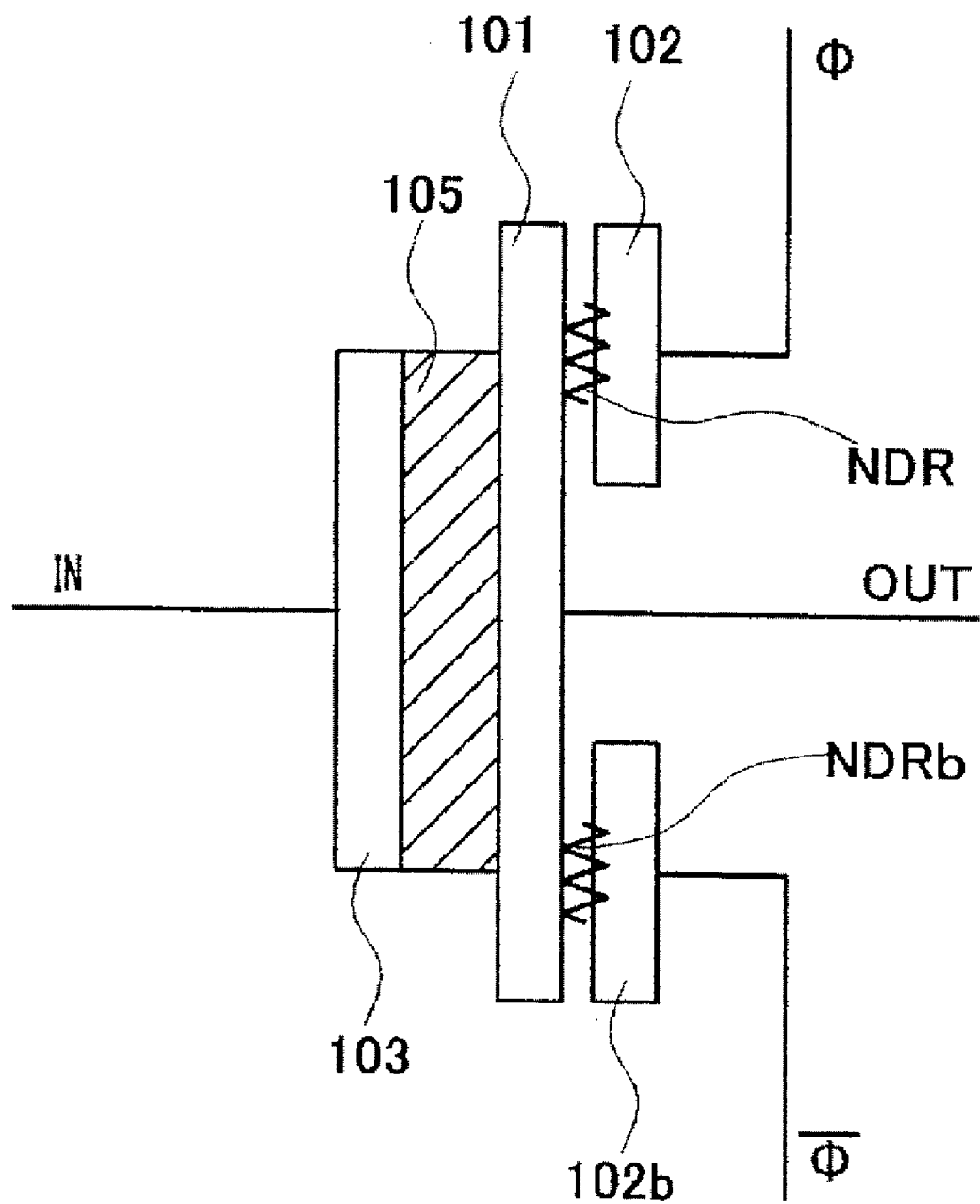

[Figure 9]
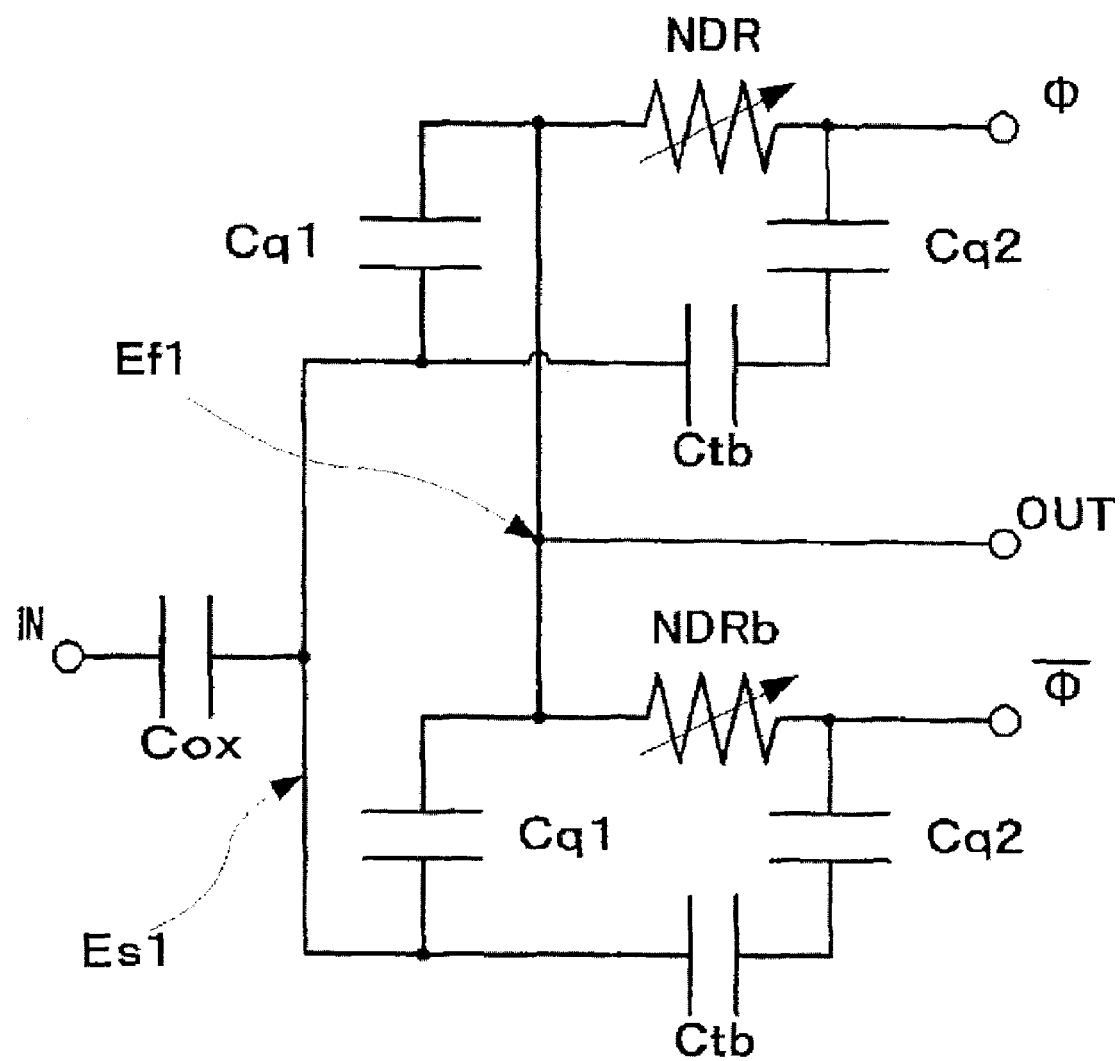

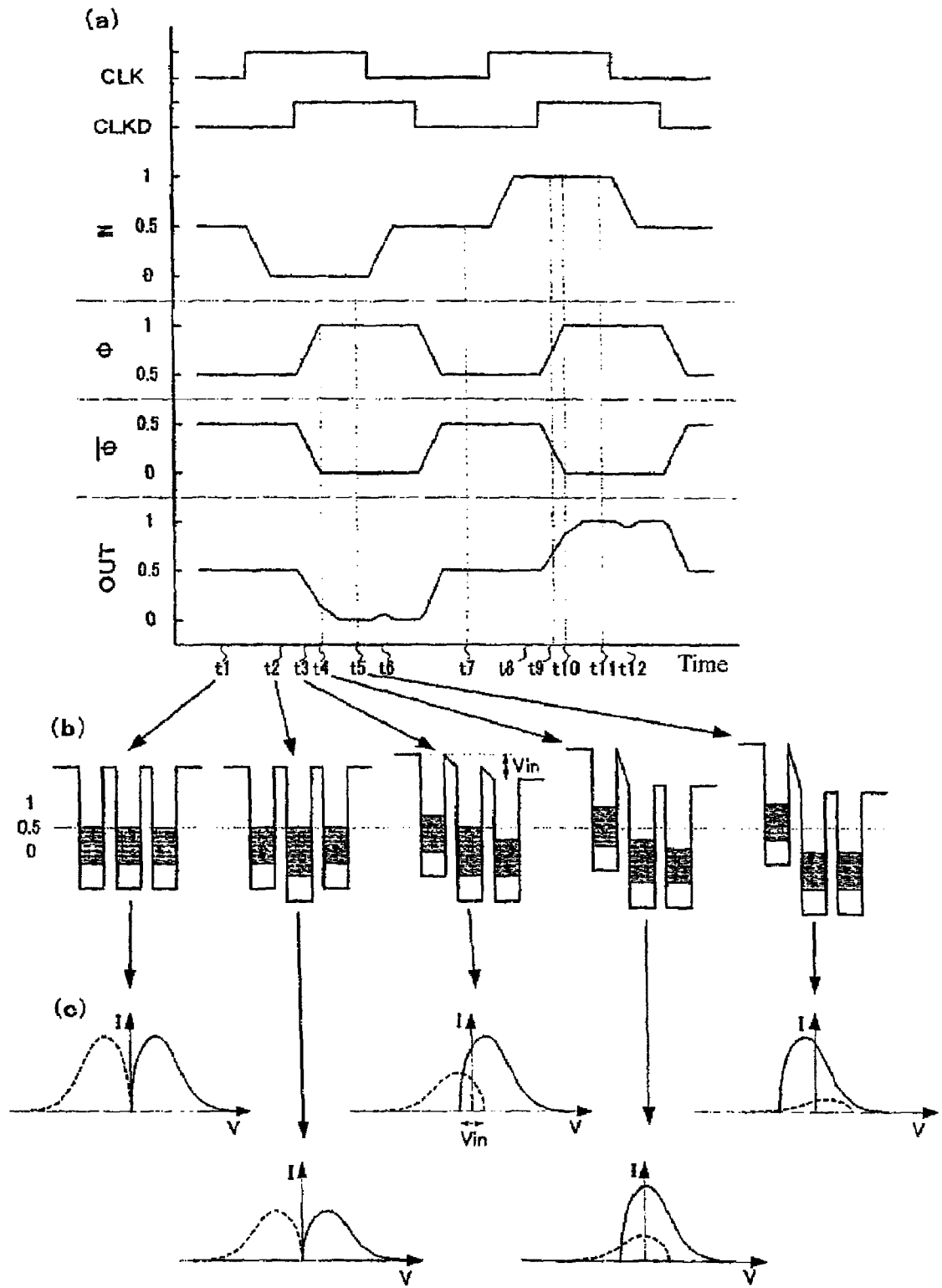
[Figure 10]

[Figure 11]
| IN | Φ | Φ̄ | OUT |
|----|---|----|-----|
| 0  | 1 | 0  | 0   |
| 1  | 1 | 0  | 1   |
[Figure 12]
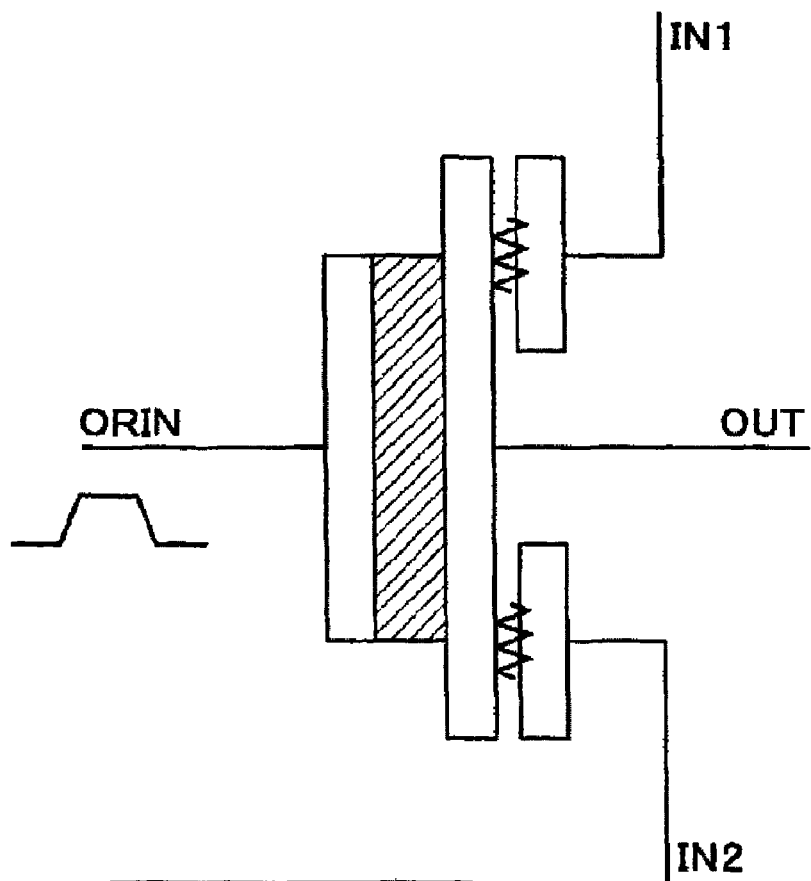
| IN1 | IN2 | OUT |
|-----|-----|-----|
| 0   | 0   | 0   |
| 0   | 1   | 1   |
| 1   | 0   | 1   |
| 1   | 1   | 1   |

[Figure 13]
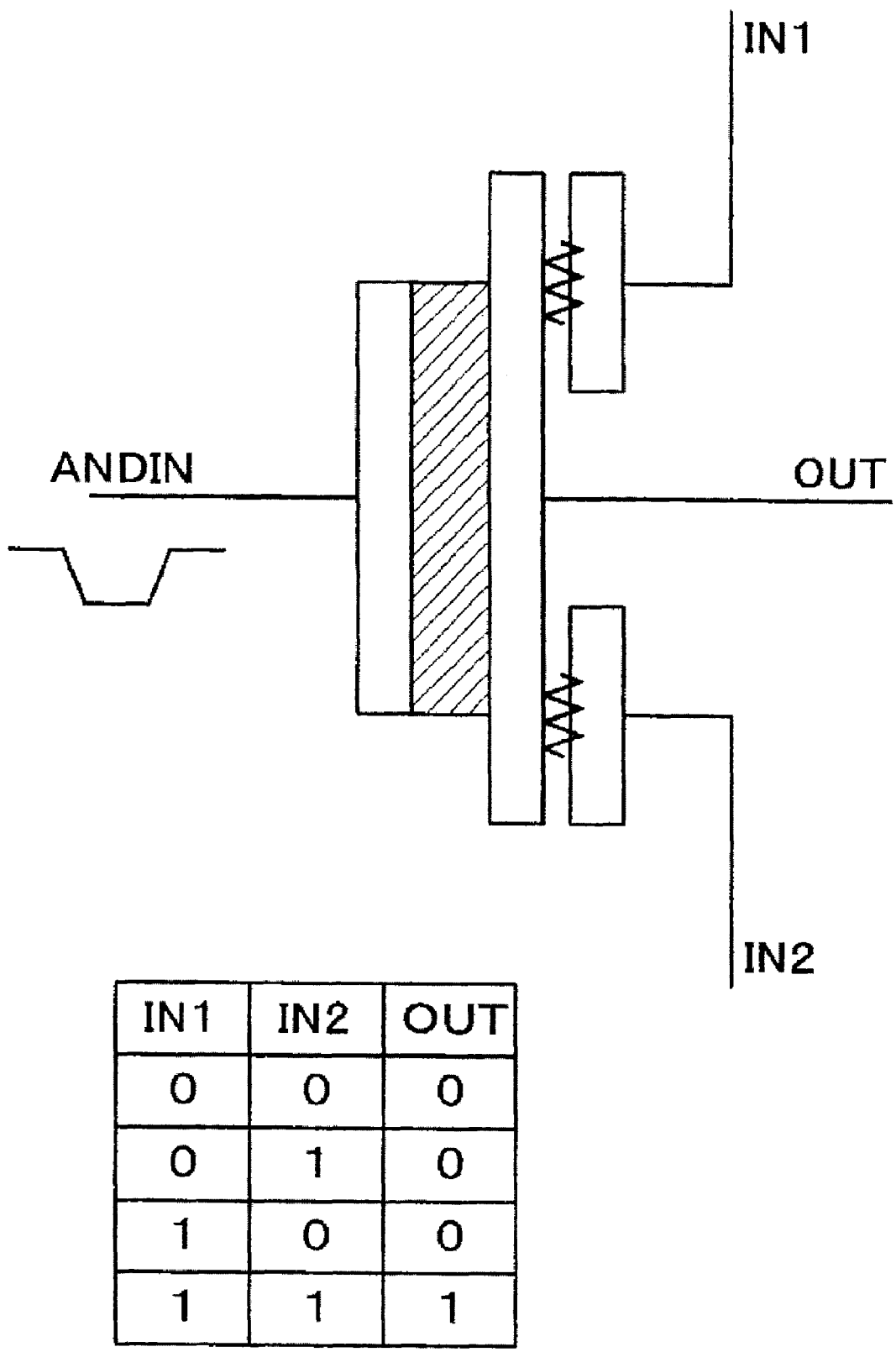

[Figure 14]
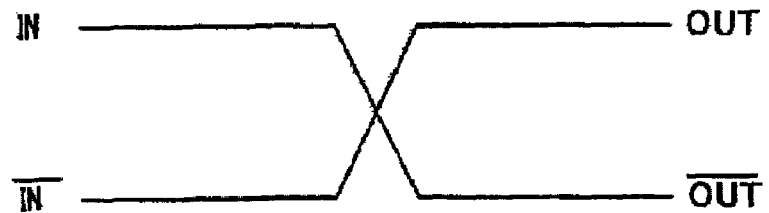
| IN | OUT |
|----|-----|
| 0  | 1   |
| 1  | 0   |
[Figure 15]
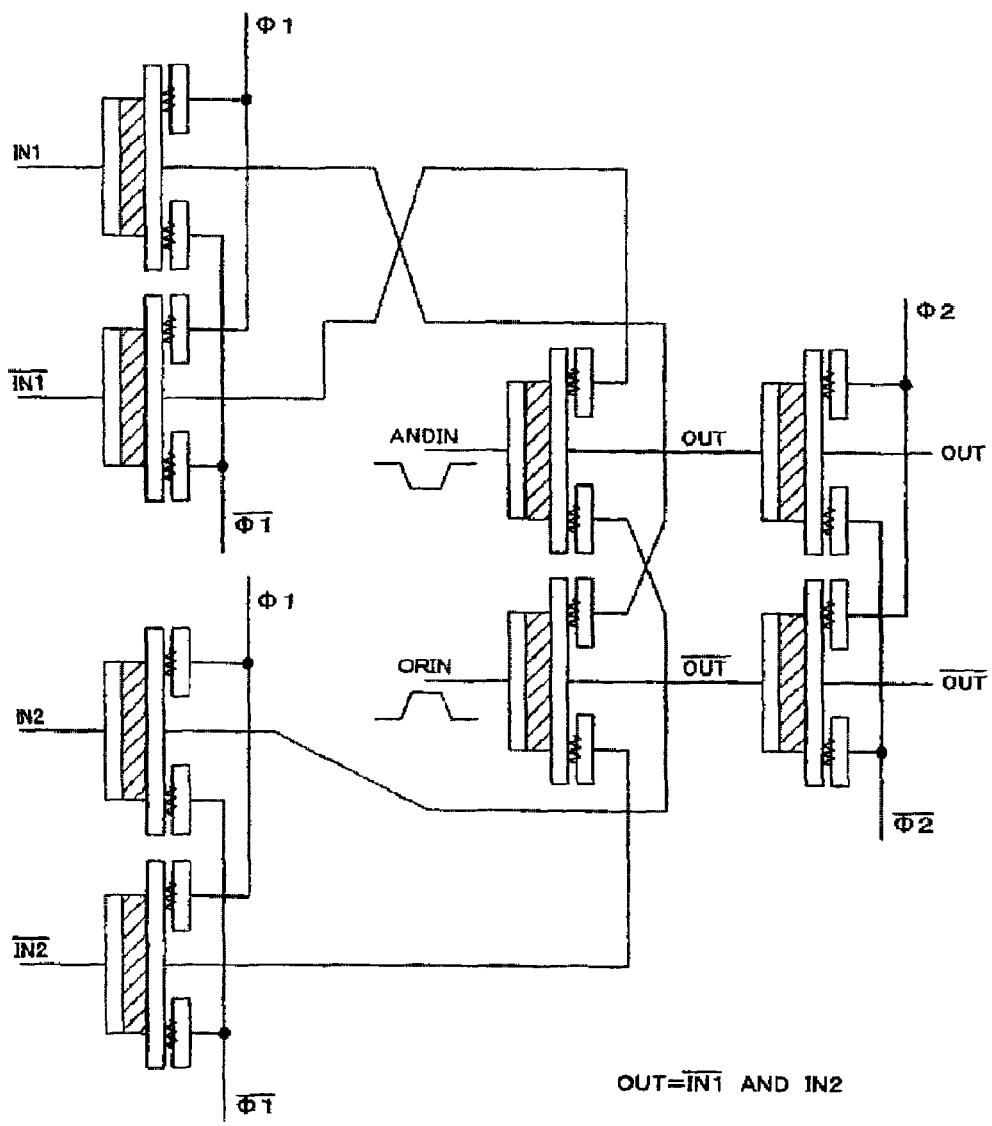
OUT=$\overline{IN1}$ AND IN2

[Figure 16]
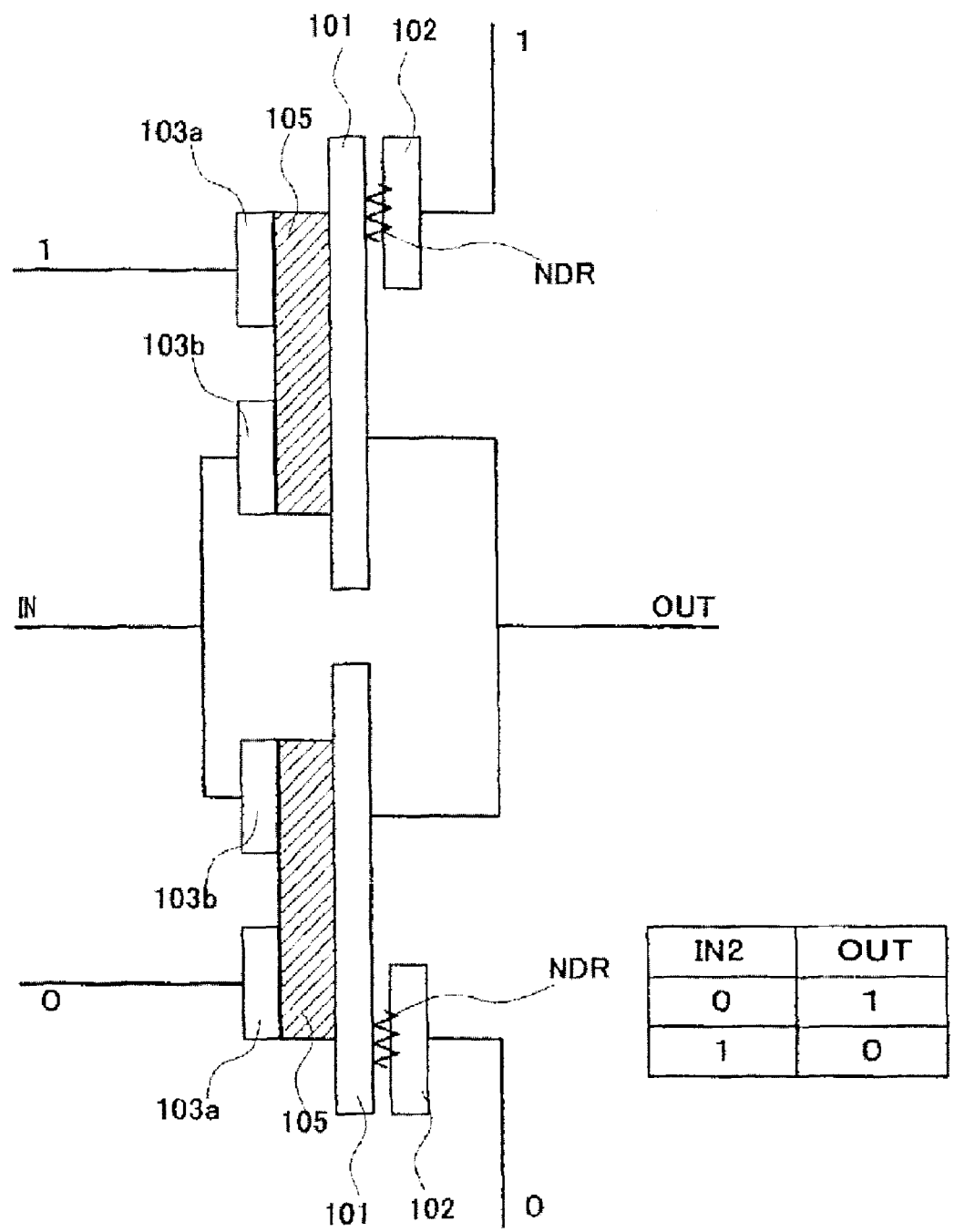

COMPLEMENTARY LOGIC CIRCUIT

CROSS-REFERENCE TO RELATED APPLICATIONS

This application is filed under 35 U.S.C. 371(c) claiming priority of PCT/JP2005/009693 filed May 31, 2004, the entire text of which is specifically incorporated by reference herein.

FIELD OF THE INVENTION

The present invention relates to a quantum device, a quantum logic device, a method of driving the quantum logic device, and a logic circuit. Particularly the present invention relates to a technique effectively used for a quantum device which operates stably with low power consumption even in a fine scaled dimension theoretically unavailable in silicon MOSFETs having become mainstream at present, and which can constitute a complementary logic circuit of a system consistent with the implementation of a classical computer using existing sequential circuits.

BACKGROUND ART

It is already known that CMOSFETs (CMOS Field Effect Transistors) using CMOS (Complementary-Metal Oxide Semiconductor) technology are mainly used as the logic elements of current information processing systems such as computers. Further, it is known that finer design rules have been advanced for CMOSFETs with great effort in response to the need for higher performance of information processing systems. As already known, CMOS technology is based on planar technology, in which thin films of an insulator, a semiconductor, and a conductor are formed on a semiconductor substrate, the thin films are etched using photolithography or an impurity is implanted into the semiconductor substrate, and members and areas having been subjected to etching or impurity implantation are laminated to form predetermined devices. When an FET is constituted of a simple planar gate electrode using planar technology, a gate length affecting the performance of the FET is decided by the accuracy of patterning. The accuracy of patterning determines the limit of the finer design rules of FETs. Currently in order to exceed the limit of the finer design rules, studies have been conducted in view of sophistication of various process technologies including thin film formation, lithography, and etching or material development which is advantageous to the existing process technology.

However, the FETs with the planar gate electrode using CMOS technology are expected to reach a technical limit in about 2016. That is, various undesirable effects caused by a shorter gate length (and thinner oxide thickness) become more pronounced as MOSFETs advance in fine design rule. As a representative short channel effect, the following is known: an increase in off current and a reduced level of control due to hot electrons. A large off current increases power consumption. Considering that an operating frequency (clock frequency) tends to increase, an increase in power consumption per area is a serious problem.

Two approaches are available to exceed the technical limit. The first approach is to gradually extend the technical limit based on the current CMOS technology. The second approach is, for upcoming times of nanomolecular devices, to search for a logic device based on a new operating principle in the background of nanophysics aimed at physical phenomena of atoms and molecules.

Techniques classified into the first approach include attempts of material engineering, in which studies are conducted on a carbon nanotube used as the channel of an FET and a high-K dielectric film used instead of a gate oxide film. Further, a FinFET is studied which has a gate electrode (channel) shaped like a fin in the gate structure of a CMOSFET, and a multi(double)-gate FET is studied which has a plurality of (two) gate electrodes on a channel.

The second approach is to study principles and cannot make considerable progress overnight. It is necessary to make steady efforts and satisfactory results are not obtained at present. For example, non-patent document 1 describes the present circumstances of nanomolecular devices. In parallel with a new system such as QCA (Qauntum Celler Automaton), two-terminal devices having been studied in the past have received attention again as devices applicable to logic circuits, in the context of a new device technology of nanomolecular devices. For example, a configuration of method logic circuits is available which uses ordinary diodes. Non-patent document 2 describes a configuration method of logic circuits using Esaki diodes, which are NDR (negative differential resistance) devices. Further, non-patent document 3 describes a Y-branch switch which has been studied in association with the implementation of a BDD (Binary Decision Diagram).

[Non-patent document 1] R. Compano, L. Molenkamp, D. J. Paul, Technology Roadmap for nanoelectronics, European Commission IST Programme: Future and Emerging Technologies, Microelectronics Advanced Research Initiative, http://nanoworld.org/NanoLibrary/nanoroad.pdf

[Non-patent document 2] R. H. Mathews, J. P. Sage, T. C. L. Gerhard Sollner, S. D. Calawa, C.-L. Chen, L. J. Mahoney, P. A. Maki, and K. M. Molvar Proc. IEEE, vol. 87, no. 4, pp. 596-605, April 1999.

[Non-patent document 3] T. Palm and L. Thylen, "Designing logic functions using an electron waveguide Y-branch switch," J. Appl. Phys. vol. 79, pp. 8076, May 1996.

DISCLOSURE OF THE INVENTION

Problems to be Solved by the Invention

Historically, considering the development of logic devices which have made the transition to mechanical relays, vacuum tubes, bipolar semiconductors, and CMOS semiconductors, it is understood that physical operating principles used by the devices also make the transition to the use of a mechanical motion of electromagnetic induction (mechanical relay), the use of a behavior of electrons in a free space (vacuum tube), the use of a behavior of carriers in a semiconductor band (bipolar semiconductor), and the use of two-dimensional electron gas (CMOS semiconductor). In the last stage of each technology, attempts are made through material engineering and so on to improve an existing system. When a next-generation technology is developed with a new operating principle, the device of an existing technology is replaced with a device of the new technology. Main requirements for replacing an existing technology with a new technology are a degree of integration and power consumption. Historically, when an existing technology is replaced with a new technology, a degree of integration and power consumption are dramatically improved.

From the technical point of view, it has been pointed out that the current CMOS technology has reached its limit particularly in a degree of integration and power consumption. As described above, the two approaches are available to exceed the limit. The inventor has selected the second approach as a solution. Although the first approach is an effective technique in the short term, devices of a new principle will be inevitably demanded soon or later from the historical point of view. A dramatic technical breakthrough can be expected from the devices of new operating principles.

However, in the solution of the second approach, any particular technologies are not foreseen as post CMOS technology. Only the direction of a new technology exploiting nanophysics is expected and thus it is necessary to define a completely new technology substituting for CMOS technology.

What technical factors are necessary for a new technology? Based on a presumption of the historical trend, it is expected that an important indicator in a new technology is improvement in a degree of integration and power consumption. A new technology has to positively ensure superiority over CMOS technology in a degree of integration and power consumption. Meanwhile, considering an infrastructure including an enormous amount of software in current computers, it is not preferable to adopt a technology requiring a completely new computation method, e.g., a technology of a quantum computer for the following reason: it is expected that a technology using a completely new calculating method cannot effectively utilize an existing infrastructure, raising a commercial hurdle too high as well as a technical hurdle. Hence, it is preferable that a new technology satisfies a requirement permitting the use of an existing infrastructure, e.g., a system consistent with the implementation of a classical computer using existing sequential circuits.

As logic devices based on nanophysics, the NDR device and the Y-branch switch described in background art can be solutions. That is, a diode using the tunnel effect of a single barrier (e.g., an Esaki diode) and a diode using a resonant tunneling effect between double barriers (e.g., a resonant tunneling diode) are representative examples of a two-terminal nanodevice having an NDR characteristic. The NDR characteristic enables a predetermined logic operation by using an operation system of a differential clock and using a majority logic. The Y-branch switch is a switch device using a quantum interference effect. A logic circuit can be configured using the switching property of the Y-branch switch. Since both of the devices are nanodevices, the limit of fine design rules may be extended significantly.

However, in a logic circuit using an NDR device of the conventional art, an input and an output are isolated by a resistance element or an inductance element and a trade-off relationship exists between an input gain and input/output isolation. That is, when a large input gain is obtained, the input and output cannot be isolated. When the input and output are isolated, a large input gain cannot be obtained. In the NDR device of the conventional art, a logic circuit is configured using a majority logic. It has been pointed out that a logic circuit using a majority logic is so defective that a logic operation is considerably affected by variations in I-V characteristic between elements. Thus, it is necessary to take measures to increase process accuracy and so on.

On the other hand, the Y-branch switch is studied in association with the implementation of a BDD and is not always suitable for the implementation of sequential circuits, which are used for most information processing systems at present. Further, when the Y-branch switch does not use a gate, an input/output gain cannot be obtained. When a gate is added, a manufacturing technology becomes complicated undesirably.

A logic circuit using ordinary diodes is not based on nanophysics. Even if a fine design is achieved, some problems arise: although any combinational logic circuit can be obtained by connecting, in multiple stages, basic logic circuits using ordinary diodes, the connection in multiple stages causes static current, which is undesirable in view of power consumption. The circuit configuration has to become complicated to prevent static current, so that such a connection is not suitable for the configuration of a logic circuit.

Moreover, since a QCA device has a high impedance, it is hard to obtain a current gain, resulting in inefficient charging/discharging of a parasitic capacitance when packaging the device.

An object of the present invention is to provide a technique which can achieve performance exceeding the current CMOS technology in fine design and power consumption and obtain a logic circuit of a system consistent with the implementation of a classical computer using existing sequential circuits. Another object is to provide a technique achieving such a logic circuit without using a majority logic. Still another object is to provide a technique which causes no trade-off between input/output isolation and a gain, that is, achieves input/output isolation and an input gain.

SUMMARY OF THE INVENTION

Prior to the explanation of an invention disclosed in the present specification, the following will discuss a physical phenomenon used in the present invention. Although the physical phenomenon has to be examined fundamentally in a quantitative manner, only a qualitative explanation will be given for the sake of clarity. The following will make only an explanation required for understanding the invention.

The present invention uses a quantum effect when electrons or holes (carriers) are confined on a specific position in a real space. Carriers are confined by, e.g., a quantum well (QW). The following will discuss QW which confines carriers in a one-dimensional direction. The same examination is applied to a quantum wire (QL) which confines carriers in a two-dimensional direction and a quantum dot (QD) which confines carriers in a three-dimensional direction. Carriers will be described as electrons in the following explanation.

As already known, QW is formed by a potential well using a heterojunction of a semiconductor or the like. When QW is sufficiently small in width, electrons in QW are confined in the width direction (z direction) and electron energy is quantized and becomes discrete. The lowest quantized electronic energy has level $E1$. Although higher energy levels $E2$, $E3$, ... ($E1<E2<E3<$ ... ) are available, only $E1$ will be discussed below for simple explanation.

Although electrons are confined in z direction, x direction and y direction perpendicular to z direction have a degree of freedom and thus electrons in QW become two-dimensional electron gas (2DEG) according to a degree of freedom of electrons. The energy of 2DEG constitutes a subband where $E1$ and a Fermi level $Ef$ are disposed at edges ($E1<Ef$). $Ef$ reflects an electron density of 2DEG. This state is shown in FIG. 1. FIG. 1 is an energy band diagram of an isolated QW. In FIG. 1, the vertical axis represents an electron energy and the horizontal axis represents a distance in z direction. A state function corresponding to $E1$ is denoted as $\Phi e1$. As already known, the tail of $\Phi e1$ typically goes beyond a heterointerface to the outside of the QW.

The following will examine the case where two QWs (QW1, QW2) are formed sufficiently close to each other. As described above, $\Phi e1$ ($\Phi e11$, $\Phi e12$) of each QW partially lies outside the QW. Thus, when QW1 and QW2 are sufficiently close to each other, a state similar to that of a diatomic molecule appears and a state of a coupled quantum well appears in which $\Phi e11$ and $\Phi e12$ are coupled resonantly. In a state where $\Phi e11$ and $\Phi e12$ are coupled, E1 is divided into two levels of Es and Eas. Es corresponds to a state of symmetric coupling and Eas corresponds to a state of asymmetric coupling. FIG. 2 is an energy band diagram showing a state of the coupled quantum well. The vertical axis represents an electron energy and the horizontal axis represents a distance in z direction. State functions corresponding to Es and Eas are denoted as $\Phi$es and $\Phi$eas, respectively. In a state where the two QWs form the coupled quantum well, a tunnel current is fed between QW1 and QW2 due to a phase difference between $\Phi$es and $\Phi$eas. Since the subbands of QWs have the shared electron energy levels Es and Eas, 2DEG in the coupled quantum well has Es and Eas as two edges on a low potential side and Ef as a common edge on a high potential side. However, the coupling of the subbands is made only when the subbands of the QWs are almost at the same level. When a potential difference is applied to QW1 and QW2 by an external electrode or the like, the QWs are displaced from each other in subband level and thus coupling disappears. In a state where coupling disappears, QW1 and QW2 are nearly isolated from each other and a tunnel current caused by a phase difference of wave functions does not flow between the QWs.

In the system described in the previous paragraph, the coupling between the subbands is changed by a potential difference between QW1 and QW2 and a preferred NDR characteristic is expected to appear in current-voltage characteristics (I-V characteristics). FIG. 3 shows the expected I-V characteristics between QW1 and QW2. In the I-V characteristics of FIG. 3, as a potential difference increases in absolute value, three areas appear. The areas are a positive differential resistance area (A area) which corresponds to a state where resonant coupling occurs between the subbands, a negative differential resistance area (B area) which corresponds to a state where a tunnel current is applied due to an overlap of the tails of $\Phi e11$ and $\Phi e12$ spreading to the outside of the heterointerface, though the resonant coupling is absent or is disappearing, and an isolation area (C area) which corresponds to a state where the resonant coupling disappears and only a small amount of normal tunnel current is applied due to an overlap of the tails of $\Phi e11$ and $\Phi e12$ spreading to the outside of the heterointerface. Additional-resonant coupling may be formed by high energy levels (E2, E3, . . . ) which are ignored in this examination. Thus, a tunnel current may flow by the high energy levels under some design conditions.

The present invention is based on the foregoing physical findings. The configuration of the present invention will be described below.

A quantum device, in a real space where a given first direction is defined, comprising: a first quantum structure area and a second quantum structure area, the areas confining carriers at least in the first direction, a tunnel barrier area between the first quantum structure area and the second quantum structure area, a first electrode area for injecting carriers into the first quantum structure area from a direction not disturbing a quantum confined state in the first direction of the first quantum structure area, the direction being parallel to a plane perpendicular to the first direction, a second electrode area for injecting carriers into the second quantum structure area from a direction not disturbing a quantum confined state in the first direction of the second quantum structure area, the direction being parallel to a plane perpendicular to the first direction, a carrier conduction area, and an isolation area arranged between the first quantum structure area and the carrier conduction area.

In this quantum device, the first quantum structure area, the second quantum structure area, and the tunnel barrier area constitute the system of the coupled quantum well. Further, the preferred NDR characteristic is found in the I-V characteristics between the first quantum structure area and the second quantum structure area. However, the I-V characteristics are predicated upon the system with the quantum confined states in z direction. Thus, it is necessary to inject carriers into the first quantum structure area and the second quantum structure area without disturbing the quantum confined state in z direction. For this reason, the quantum device of the present invention comprises the first electrode area or the second electrode area for injecting carriers into the first quantum structure area or the second quantum structure area along a plane perpendicular to the first direction. The quantum confined state in z direction is not changed as long as carriers (electrons) are injected along a plane perpendicular to z direction. Hence, by applying a voltage between the first electrode area and the second electrode area, a current flowing between the electrode areas has the foregoing I-V characteristics and the NDR characteristic of the I-V characteristics can be used for generating a logic state of a logic circuit.

In the quantum device, the spatial arrangement of the first electrode area or the second electrode area is specified using phrases like a plane "perpendicular" to the first direction and a direction "parallel" to the plane. In this case, a word "perpendicular" or "parallel" should not be given a strict meaning. A departure from the strict meaning of "perpendicular" and "parallel" is accepted as long as "a quantum confined state in the first direction is not disturbed." "Perpendicular" and "parallel" will be similarly interpreted in other inventions such as a quantum logic device (described later). Whether "a quantum confined state is not disturbed in the first direction" or not can be determined depending upon whether the NDR characteristic is obtained in the I-V characteristics. This is because as long as the NDR characteristic is obtained by a physical model, which is the quantization (confinement of carriers) of the first quantum structure area and the second quantum structure area, the presence of the NDR characteristic indicates that a quantum confined state is not disturbed in the first direction. That is, whether carriers are injected from a "direction" not disturbing a quantum confined state in the first direction can be determined by the presence or absence of the NDR characteristic. It is understood that in the present invention, as long as the NDR characteristic is present, carriers are injected from "a direction not disturbing a quantum confined state."

Incidentally, according to the physical findings, the band structure of the subband is determined by Es (or E1) and the Fermi level Ef of 2DEG is determined by a density of electrons injected into the subband. When one of the quantum structure areas (in this case, the first quantum structure area) is changed in band potential by an external electrostatic field, it is possible to change the potential of the subband of the first quantum structure area (edge on a low potential side of 2DEG). On the other hand, the Fermi level Ef of 2DEG corresponds to the maximum energy level of carriers injected to the subband, and thus the Fermi level Ef of the first quantum structure area can be controlled by the first electrode area for determining the potential of the second quantum structure area (voltage of the second electrode area) when the quantum structure areas are resonantly coupled. That is, the subband edge of the first quantum structure area can be controlled by an electrostatic field applied to the first quantum structure area, and the Fermi level of the first quantum structure area can be independently controlled by the first electrode area or the second electrode area in resonant coupling. The quantum device of the present invention comprises the carrier conduction area for controlling the subband edge of the first quantum structure area. The carrier conduction area generates an electrostatic field applied to the first quantum structure area via the isolation area.

The independent control of the subband edge and the Fermi level can be modeled by a concept of virtual node separation in which the potential of the first quantum structure area is determined by two node potentials divided by a capacitance Cq of the first quantum structure area. FIG. 4 is an equivalent circuit which is a model of the quantum device of the present invention. Reference character VR denotes a resistance model between the first quantum structure area and the second quantum structure area. The VR is modeled by a resistance having the NDR characteristic. Reference numerals Cq1 and Cq2 denote the capacitances of the first quantum structure area and the second quantum structure area. Reference character Ctb denotes the capacitance of the tunnel barrier area. Reference character Cox denotes the capacitance of the isolation area. As shown in FIG. 4, the subband edge Es1 and the Fermi level Ef1 of the first quantum structure area are virtually divided by the quantum capacitance Cq1 of the first quantum structure area. Further, the subband edge Es2 and the Fermi level Ef2 of the second quantum structure area are virtually divided by the quantum capacitance Cq2 of the first quantum structure area. When the first quantum structure area and the second quantum structure area are resonantly coupled because Es1 and Es2 match with each other, VR is conducting. In a state of equilibrium, Ef1 and Ef2 match with each other. By adding a third terminal which is the carrier conduction area, an NDR device (VR) originally serving as a two-terminal element can be caused to act as a three-terminal element such as a transistor. With this configuration, it is possible to avoid a trade-off between an input gain and input/output isolation. The trade-off has been a problem in the NDR device. Further, it can be also said that I-V characteristics between the first electrode area and the second electrode area appear due to the potential relationship of the subbands of the first quantum structure area and the second quantum structure area and thus a voltage applied to the carrier conduction area can change I-V characteristics between the first electrode area and the second electrode area.

When the quantum device of the present invention is regarded as the three-terminal device, a semiconductor or conductor, which generates an electrostatic field affecting the carrier conduction area, that is, an electrostatic field affecting the subband of the first quantum structure area corresponds to the gate of a transistor, and the first quantum structure area and the second quantum structure area correspond to the source and drain of the transistor. In the quantum device of the present invention, a configuration corresponding to the channel of the transistor is the tunnel barrier area according to analogy that carriers act as the control area of passing carriers. In typical quantum devices such as an Esaki diode and a resonant tunneling diode, quantum confinement does not exist or exist only in a channel. The quantum device of the present invention is different from the conventional quantum device in that the source and drain have to be quantized.

In the quantum device, the first quantum structure area and the second quantum structure area have to confine carriers at least in the first direction (z direction) and carriers may be confined in other directions. When carriers are confined in one direction (one dimension), the first quantum structure area and the second quantum structure area constitute a quantum well (QW) as described above. When carriers are confined in a two-dimensional direction, the first quantum structure area and the second quantum structure area constitute a quantum wire (QL). When carriers are confined in a three-dimensional direction, the first quantum structure area and the second quantum structure area constitute a quantum dot (QD). Also when a quantum wire or a quantum dot constitutes the first quantum structure area and the second quantum structure area, a quantum confined state in z direction is not changed as long as carriers are injected along a plane perpendicular to the first direction (z direction).

In the quantum device, the carrier conduction area is arranged on a position or in a shape such that an electric field generated by a potential applied to the carrier conduction area has a greater influence on the electrostatic potential of the first area structure area as compared with the electrostatic potential of the second quantum structure area. The carrier conduction area can be arranged on any position or in any shape as long as an electric field affecting the subband of the first area structure area is generated. It is specified that when the second quantum structure area is simultaneously affected, it is necessary to arrange the carrier conduction area on a position or in a shape such that the influence on the first quantum structure area is greater than that on the second quantum structure area. Needless to say, the "influence" is exerted on the subband of each of the quantum structure areas.

In the quantum device, the subband level of the first quantum structure area is controlled by an electric field generated by the carrier conduction area, the subband level being generated by confining carriers in the first quantum structure area, and the Fermi level of carriers of the first quantum structure area is controlled by a potential applied to the first electrode area or a potential applied to the second electrode area when the first quantum structure area and the second quantum structure area are resonantly coupled. The present invention is understood by focusing attention on the function of virtual node separation.

The quantum device has a positive differential resistance state appearing due to a tunnel effect of a resonant coupling between the first quantum structure area and the second quantum structure area, the resonant coupling occurring between the state functions of the energy levels of the first quantum structure area and the second quantum structure area due to a potential difference between the first quantum structure area and the second quantum structure area, a negative differential resistance state appearing between the first quantum structure area and the second quantum structure area due to an overlap of the state functions of the energy levels spreading to the tunnel barrier area, though a resonant coupling is absent or is disappearing, and an isolation state between the first quantum structure area and the second quantum structure area, the isolation state having no resonant coupling or overlap of the state functions or having a negligible overlap of the state functions. To understand the present invention, attention is focused on physical mechanisms generated by three areas divided from the I-V characteristics of the quantum device. The three areas of the I-V characteristics are understood according to the actual I-V characteristics as follows: the quantum device has areas of a positive differential resistance area which has a positive correlation between a voltage and a current as a voltage difference between the first electrode area and the second electrode area has a larger absolute value in current-voltage characteristics between the first electrode area and the second electrode area, a negative differential resistance area having a negative correlation between a voltage and a current, and an isolation area where no current is applied or a current equal to or 10% lower than a current peak value is applied even when a voltage increases in absolute value. In this case, the isolation area also includes the state where a current equal to or 10% lower than the current peak value is applied. This is because the area where a current equal to or 10% lower than the peak value is applied is equal in function to the isolation area.

In the quantum device, a plurality of second quantum structure areas may be formed on the plane perpendicular to the first direction. Further, a plurality of first quantum structure areas may be formed on a plane perpendicular to the first direction and a plurality of second quantum structure areas may be formed on another plane perpendicular to the first direction. Moreover, a plurality of carrier conduction areas may be formed and different potentials may be applied to the plurality of carrier conduction areas. Various quantum logic devices can be configured by providing the plurality of first quantum structure areas, second quantum structure areas, or carrier conduction areas.

The above-described quantum device can be readily superior in a fine dimension, which is regarded as the limit of the current CMOS technology. Presently advanced CMOSFET has a gate length of about 90 nm and problems associated with finer dimensions have been pointed out. In the quantum device of the present invention, a part which corresponds to a channel and is made of an ordinary material (GaAs and AlGaAs) has a length of several nm (a length in z direction of the tunnel barrier). Thus, it is readily understood that a one-order of magnitude or more finer design can be made. Additionally, the quantum device of the present invention does not have a gate voltage threshold value peculiar to a CMOSFET. Hence, it is possible to considerably scale down a circuit driving voltage and power consumption is highly expected to decrease due to a low driving voltage.

The following will disclose two quantum logic devices to be disclosed in the present specifications. The first quantum logic device is constituted of the same members as the quantum device but is different in that the quantum logic device has a pair of (two) second quantum structure areas. The quantum logic device has a pair of second electrode areas corresponding to the pair of second quantum structure areas. The first quantum logic device constitutes a latch circuit using the quantum device constituted of these members. The carrier conduction area serves as an input, the first electrode area serves as an output, one of the second electrode areas is in "1" state (high voltage state), and the other second electrode area is in "0" state (low voltage state). Alternatively, the first quantum logic device constitutes an OR logic circuit using the quantum device constituted of the same members. The pair of second electrode areas serves as inputs, the first electrode area serves as an output, and the carrier conduction area is in "1" state (high voltage state). Alternatively, the first quantum logic device constitutes an AND logic circuit using the quantum device constituted of the same members. The pair of second electrode areas serves as inputs, the first electrode area serves as an output, and the carrier conduction area is in "0" state (low voltage state).

A second quantum logic device is constituted of the same members as the quantum device but is different in that the quantum logic device has a pair of (two) carrier conduction areas. The second quantum logic device constitutes a NOT logic circuit using the two quantum devices constituted of these members. When one of the two quantum devices acts as a first device and the other device acts as a second device, one of the carrier conduction areas of the first device and one of the carrier conduction areas of the second device serve as inputs, the first electrode area of the first device and the first electrode area of the second device serve as outputs, the other carrier conduction area of the first device and the second electrode area of the first device are in "1" state (high voltage state), and the other carrier conduction area of the second device and the second electrode area of the second device are in "0" state (low voltage state).

With the first or second quantum logic device, by properly configuring the inputs or outputs, it is possible to achieve the latch circuit, which is necessary for the configuration of the sequential circuit, and the AND circuit, OR circuit, and NOT circuit which are the basic logic circuits of all the combinational logic circuits. Therefore, the quantum devices can constitute a logic circuit of a system consistent with the implementation of a classical computer using existing sequential circuits. The operations of the quantum logic device for obtaining the circuit configurations will be specifically discussed later.

In the first or second quantum logic device, the members constituting the device have the same characteristics as the quantum device.

In the driving of the first or second quantum logic device, a logic circuit driving system in a multiphase clock mode can be adopted in which a signal is applied to the carrier conduction area in synchronization with a first clock signal and a signal is applied to the second electrode area in synchronization with a second clock signal delayed from the first clock signal by a predetermined phase. By driving the circuit in the multiphase clock mode, a signal is applied to the carrier conduction area, that is, the subband of the first quantum structure area is controlled before a signal is applied to the second electrode area, that is, the Fermi level of the first quantum structure area is controlled, so that a logic operation is stabilized and the gain of an output signal can increase relative to an input signal.

In the driving of the first or second quantum logic device, a logic circuit driving system can be adopted which has an equalizing period for equalizing the potentials of the first quantum structure area, the second quantum structure area, and the carrier conduction area from the time a signal is applied to the second electrode area until the time a signal is applied to the carrier conduction area. The equalizing period can speed up and stabilize operations. Even when the equalizing period is provided, problems such as leakage current do not occur in the equalizing period. On the contrary, when the quantum device has a large current in the isolation area, leak current can be eliminated in a standby state.

In the driving of the logic circuit configured by arbitrarily combining the first quantum logic device, a logic circuit driving system for driving logic circuits in a differential mode can be adopted. In the differential mode, an input signal and an inverted input signal are inputted and an output signal and an inverted output signal are outputted. By using the differential mode, it is possible to eliminate circuit disturbing factors such as crosstalk noise and readily implement a NOT logic. The NOT logic can be configured by inverting and outputting an input signal in the differential mode.

Any combinational logic circuits can be configured by combining the AND circuit, the OR circuit, and the NOT circuit in the first and second quantum logic devices. These combinational logic circuits can be also regarded as one form of the present invention.

When the first quantum logic device is driven in the differential mode, any combinational logic circuits can be configured by implementing a given AND circuit, an OR circuit, or a NOT logic obtained by the logic circuit driving system in the differential mode. These combinational circuits can be also regarded as one form of the present invention.

The combinational logic circuit and the latch circuit in the first quantum logic device can be connected in cascade. In the combinational logic circuit, charge is supplied from the output of a circuit in a preceding stage to the input of a circuit in a subsequent stage, thereby achieving effective charge recycling. In the latch circuit of the present invention, an input is amplified to a power supply voltage. Thus, when a sufficient charge is not supplied from the preceding stage, an enough charge is supplied from the latch circuit having a cascade connection, thereby reducing power consumption. When the circuit includes a plurality of latch circuits, different first clock signals and second clock signals can be applied to the plurality of latch circuits, so that the sequential circuit can be configured with ease.

ADVANTAGES OF THE INVENTION

According to the present invention, it is possible to achieve performance superior to the current CMOS technology in fine design and power consumption and obtain a logic circuit of a system consistent with the implementation of a classical computer using existing sequential circuits. Further, the present invention can provide a technique which obtains the logic circuit without using a majority logic and causes no trade-off between input/output isolation and a gain, that is, obtains input/output separation and an input gain.

Preferred Embodiment

An embodiment of the present invention will be specifically described below in accordance with the accompanying drawings. FIG. 5 is a perspective view showing an example of a quantum logic device according to an embodiment of the present invention. FIG. 6 is a sectional view taken along line A-A of FIG. 5. FIG. 7 is a sectional view taken along line B-B of FIG. 5.

The quantum logic device of the present embodiment includes a first conducting member $101a$, a first conducting member $101b$, a second conducting member $102a$, a second conducting member $102b$, a third conducting member $103a$, and a third conducting member $103b$. The quantum logic device shown in FIG. 5 has two quantum logic devices and will be described in detail later. An insulating member 104 is formed between the first conducting members $101a$ and $101b$ and the second conducting members $102a$ and $102b$, and an insulating member 105 is formed between the first conducting members $101a$ and $101b$ and the third conducting members $103a$ and $103b$. The insulating member 104 and the insulating member 105 cab each be formed as one member in xy plane. However for higher recognition, the perspective view of FIG. 5 only shows a part interposed between the first conducting members $101a$ and $101b$ and the second conducting members $102a$ and $102b$ and a part interposed between the first conducting members $101a$ and $101b$ and the third conducting members $103a$ and $103b$. An insulating member 106 (not shown in FIG. 5) is formed on +z side of the second conducting members $102a$ and $102b$, and an insulating member (not shown in FIGS. 5 to 7) is formed on −z side of the third conducting members $103a$ and $103b$. Further, an external electrode (not shown) for injecting and extracting carriers (electrons) is connected to each conducting member $101a$, $101b$, $102a$, $102b$, $103a$, and $103b$.

The conducting members $101a$, $101b$, $102a$, $102b$, $103a$, and $103b$ are members formed in straight lines and are disposed according to a spatial arrangement shown in FIG. 5. That is, the first conducting members $101a$ and $101b$ are formed in straight lines stretching in x direction and are arranged on xy plane. The second conducting members $102a$ and $102b$ are formed in straight lines stretching in y direction and are arranged on xy plane which is higher in z direction than the plane where the first conducting members $101a$ and $101b$ are arranged. That is, the first conducting members $101a$ and $101b$ and the second conducting members $102a$ and $102b$ intersect each other taken along z direction. The third conducting members $103a$ and $103b$ are formed in straight lines stretching in x direction, are arranged on xy plane which is lower in −z direction than the plane where the first conducting members $101a$ and $101b$ are arranged, and are arranged along the first conducting members $101a$ and $101b$.

For example, the first conducting members $101a$ and $101b$ have a thickness of several nm in z direction. The first conducting member $101a$ (first conducting member $101b$), the insulating member 104, and the insulating member 105 constitute a quantum well (QW) in z direction. In other words, carriers (electrons) are confined and quantized in z direction in the first conducting members $101a$ and $101b$. Further, it is not necessary to quantize the first conducting members $101a$ and $101b$ in x direction and y direction, so that carriers are not confined in x direction and y direction. Thus, electrons in the first conducting members $101a$ and $101b$ become two-dimensional electron gas (2DEG) spreading over the xy plane. The materials of the first conducting members $101a$ and $101b$ are not particularly limited as long as the conducting members constitute the quantum well.

As with the first conducting members, the second conducting members $102a$ and $102b$ have a thickness of, e.g., several nm in z direction. The second conducting member $102a$ (second conducting member $102b$), the insulating member 104, and the insulating member 106 (not shown in FIG. 5) provided in +z direction constitute a quantum well (QW) in z direction. Thus, as with the first conducting members, carriers (electros) are confined and quantized in z direction in the second conducting members $102a$ and $102b$. Similarly, it is not necessary to quantize the second conducting members $102a$ and $102b$ in x direction and y direction, so that carriers are not confined in x direction and y direction. Thus, electrons in the second conducting members $102a$ and $102b$ become two-dimensional electron gas (2DEG) spreading over the xy plane. The materials of the second conducting members $102a$ and $102b$ are not particularly limited as long as the conducting members constitute the quantum well.

It is not necessary to quantize the third conducting members $103a$ and $103b$ in any of x, y, and z directions. The third conducting members $103a$ and $103b$ have the function of generating an electrostatic field affecting the first conducting members $101a$ and $101b$. The materials of the third conducting members $103a$ and $103b$ are not particularly limited.

The insulating member 104 is an insulating film formed between the first conducting members $101a$ and $101b$ and the second conducting members $102a$ and $102b$. The insulating member 104 has a small thickness enough to pass a large tunnel current. For example, the insulating member 104 is several nm or smaller in thickness. The material of the insulating member 104 is not particularly limited as long as the material can form the quantum well and the material can be small in thickness enough to pass tunnel current.

The insulating member 105 is an insulating film formed between the first conducting members $101a$ and $101b$ and the third conducting members $103a$ and $103b$. The insulating member 105 is larger in thickness than the insulating member 104 or is made of a material of a high tunnel barrier so as to pass a smaller tunnel current. For example, the insulating member 105 is several nm to several tens of nm in thickness. The material of the insulating member 105 is not particularly limited as long as the quantum well can be formed and the material has a preferred insulating characteristic.

These members are disposed according to the above-described spatial arrangement, so that the quantum device described in summary of the invention is constituted of some of these members. For example, the first conducting member 101a, the second conducting member 102a, the third conducting member 103a, the insulating member 104, and the insulating member 105 constitute one quantum device. The members are associated with the quantum device as follows: the first conducting member 101a corresponds to a first quantum structure area and a first electrode area in the quantum device, the second conducting member 102a corresponds to a second quantum structure area and a second electrode area in the quantum device, the third conducting member 103a corresponds to a carrier conduction area in the quantum device, a part of the insulating member 104 corresponds to a tunnel barrier area in the quantum device, and a part of the insulating member 105 corresponds to an isolation area in the quantum device. As described above, the first conducting member 101a and the second conducting member 102a intersect each other taken along z direction. An overlap at the intersection taken along the z direction forms a coupled quantum well of the quantum device. Hence, when the first conducting member 101a and the second conducting member 102a are each divided into an intersection (overlap) and a portion other than the intersection (portion other than the overlap) taken along z direction, the overlap of the first conducting member 101a corresponds to the first quantum structure area of the quantum device and the portion other than the overlap of the first conducting member 101a corresponds to the first electrode area of the quantum device. Similarly, the overlap of the second conducting member 102a corresponds to the second quantum structure area of the quantum device and the portion other than the overlap of the second conducting member 102a corresponds to the second electrode area of the quantum device. The portions other than the overlap of the first conducting member 101a and the second conducting member 102a are provided to inject carriers to the overlap from the xy plane orthogonal to z direction, and the portions other than the overlap do not disturb the quantum confined state of the overlap. Another three quantum devices are configured by combining the members in a similar manner. That is, the another quantum devices are a combination of the first conducting member 101a, the second conducting member 102b, the third conducting member 103a, the insulating member 104, and the insulating member 105, a combination of the first conducting member 101b, the second conducting member 102a, the third conducting member 103b, the insulating member 104, and the insulating member 105, or a combination of the first conducting member 101b, the second conducting member 102b, the third conducting member 103b, the insulating member 104, and the insulating member 105.

As described above, the quantum logic device of FIG. 5 includes the four quantum devices. Of these quantum devices, two quantum devices along x direction constitute one quantum logic device. That is, the quantum logic device shown in FIG. 5 includes two quantum logic devices.

FIG. 8 schematically shows a quantum logic device. The quantum logic device of FIG. 8 is constituted of members shown in the sectional view of FIG. 7. However, the quantum devices included in the quantum logic device of FIG. 5 are equivalents and thus it is not necessary to discriminate the members such as the first conducting member 101a by adding subscripts including "a" and "b". Hence, the members having the same function are indicated by common reference numerals and the discrimination using subscripts such as "a" and "b" is omitted unless otherwise specified. The common reference numerals are used in the schematic diagram of FIG. 8. FIG. 8 shows that negative differential resistance elements NDR are inserted between the first conducting member 101 and the second conducting member 102 and associate an I-V characteristic of the quantum device. Further, an input IN, an output OUT, an input Φ, and an inverted input Φ bar are shown as inputs and outputs. To make a distinction between the second conducting members 102 fed with the Φ and Φ bar, the second conducting member fed with the Φ bar is denoted as 102b. Moreover, to make a distinction between the two NDRs, the NDR between the second conducting member 102b and the first conducting member 101 is denoted as NDRb.

In the quantum logic device of FIG. 8, the two quantum devices are connected in parallel. That is, the first quantum structure area and a carrier conduction area of each quantum device are connected in parallel. The quantum logic device of FIG. 8 is shown as an equivalent circuit in FIG. 9. FIG. 9 is a circuit diagram showing the equivalent circuit of the quantum logic device of FIG. 8. The subband of the first conducting member 101 (first quantum structure area) is controlled by an electrostatic field from a third conduction area via the insulating member 105. The Fermi level of the first conducting member 101 is so controlled as to match with one (or both) of the potentials of two second conduction areas (second quantum structure area) via NDR or NDRb. In this case, the potential of the output OUT matches with the Fermi level of the first conducting member 101. That is, on the assumption that the Φ and Φ bar are active and complementary signals, one of NDR and NDRb is turned on (positive differential resistance) and the other is turned off (negative differential resistance or isolation). Hence, OUT matches with the signal potential of one of the Φ and Φ bar. Then, a state (whether OUT matches with the Φ or Φ bar) is determined by the signal voltage of IN.

Referring to FIG. 10, the above operations will be described in detail. FIG. 10 is a diagram for explaining the operations of the quantum logic device of FIG. 8. FIG. 10(a) is a time chart, FIG. 10(b) is a band diagram, and FIG. 10(c) is an I-V characteristic diagram. In FIG. 10(a), the vertical axis indicates the voltages of clock, input, and output signals and the horizontal axis indicates time. In the quantum logic device of FIG. 8, the input signal IN is inputted in synchronization with a first clock CLK in the uppermost part of FIG. 10(a). Reference character IN denotes a signal which is, e.g., 0.5 V in an equalized state (neutral state) and 0 V or 1 V during application (in an active state).

In this quantum logic device, the Φ and Φ bar are inputted in synchronization with a second clock CLKD in the second uppermost part of FIG. 10(a). The second clock CLKD is a clock signal which is delayed by a predetermined phase from the first clock CLK. For example, the predetermined phase is about $2\pi/8$ to $2\pi/3$ and is not particularly limited as long as a normal operation is obtained. In such a multiphase clock system, prior to the application of voltage to the Φ or Φ bar, voltage is applied to IN generated from a circuit operating in synchronization with the first clock CLK, thereby obtaining a reliable operation. CLK and CLKD were described for comparison and association with a normal synchronous circuit. CLK and CLKD are not always necessary in the system of the present application.

Φ denotes a signal which has 0.5 V in the equalized state (neutral state) and 1 V during application. Moreover, the Φ bar denotes a signal which has 0.5 V in the equalized state and 0 V during application. The voltages 0 V, 0.5 V, and 1 V are just examples and thus a voltage amplitude may be reduced or increased. The voltage of 0.5 V in the equalized state is also an example. Any voltage is applicable in the equalized state as long as the voltage is an intermediate voltage of a signal amplitude.

The band diagram of FIG. 10(b) shows the potentials of the first conducting member 101, the second conducting member 102, and the second conducting member 102b when the signals are applied in the time chart. FIG. 10(b) shows five band diagrams corresponding times t1 to t5 in the timing chart of FIG. 10(a). In the band diagrams, QW on the left corresponds to the second conducting member 102 connected to Φ, QW at the center corresponds to the first conducting member 101 connected to OUT, and QW on the right corresponds to the second conducting member 102b connected to the Φ bar. Further, 2DEG is displayed on QW in each of the band diagrams. The lower end of 2DEG corresponds to a subband level and the upper end of 2DEG corresponds to the Fermi level.

FIG. 10(c) is a graph showing the I-V characteristics of the times t1 to t5 (i.e., the potential states of FIG. 10(b)). Each of the I-V characteristic graphs in FIG. 10(c) shows two I-V curves. A solid line curve indicates an I-V characteristic between the second conducting member 102b and the first conducting member 101 (i.e., between the Φ bar and OUT) and a broken line curve indicates an I-V characteristic between the second conducting member 102 and the first conducting member 101 (i.e., between Φ and OUT). The intersection point of the dotted line curve and the broken line curve is an operating point of the first conducting member 101.

Referring to the band diagram at time t1, it is found that the areas of the second conducting member 102, the first conducting member 101, and the second conducting member 102b have equalized potentials and the subbands of the areas match with one another. Thus, the two NDRs (NDR and NDRb) are both turned on and there is continuity between the Φ and Φ bar (the I-V characteristic diagram corresponding to t1). In this state, even if voltage is applied between the terminals of Φ, the Φ bar, or OUT, current is readily fed and acts in a direction leveling the voltage. However, since the Φ and Φ bar are both equalized at 0.5 V, no current is fed and OUT has a voltage of 0.5 V.

Referring to the band diagram at time t2 when 0 V is applied to IN, it is found that an electric field from the third conducting member 103 reduces the potential of the first conducting member 101. Thus, the subband level of the first conducting member 101 is shifted to the lower potential side. In this state, the subbands of the second conducting members 102 and 102b and the first conducting member 101 are slightly displaced. In response to this state, the peak of the I-V curve is slightly reduced in the corresponding I-V characteristic diagram. In this state, since NDR and NDRb are still turned on, the Fermi levels of the conduction areas match with each other.

When a voltage is applied to the Φ and Φ bar at time t3, a potential difference occurs between the second conducting member 102a and the second conducting member 102b due to a voltage Vin as shown in the corresponding band diagram. At this point, the subband of the first conducting member 101 and the subband the second conducting member 102b act so as to match with each other, whereas the subband of the first conducting member 101 and the subband of the second conducting member 102 act so as to have a large disparity. As a result, as shown in the corresponding I-V characteristic diagram, the I-V curve (solid line) between the first conducting member 101 and the second conducting member 102b increases in peak (moves in a direction of passing a larger current), whereas the I-V curve (broken line) between the first conducting member 101 and the second conducting member 102 decreases in peak (moves in a direction of feeding a smaller current).

When the I-V curves become asymmetrical as described in the previous paragraph, carriers in the first conducting member 101 become more prone to move to the second conducting member 102b (Φ bar). Conversely, carriers in the first conducting member 101 become less prone to move to the second conducting member 102 (Φ). These I-V curves are made more asymmetrical by carriers having been moved due to the asymmetry of the I-V curves. At time t4, the operating point of the I-V curve (broken line) between the first conducting member 101 and the second conducting member 102 enters the negative differential resistance area as shown in the corresponding I-V characteristic diagram. As a result, NDR is rapidly turned off. Simultaneously carriers in the first conducting member 101 and carriers in the second conducting member 102b are leveled, the subbands match with each other, and NDRb is stabilized in a turn-on state (the corresponding band diagram and I-V characteristic diagram at time t5). Hence, the potential (Fermi level) of the first conducting member 101 is stabilized at the voltage of the second conducting member 102b, and 0 V equal to the input voltage of the Φ bar is outputted as OUT. In such a stable state, even in the event of a disturbance factor such as the reset of the IN signal at time t6, necessary carriers are promptly supplied from the Φ bar and thus the stable state is not disturbed.

Contrary to the foregoing description, a voltage of 1 V is applied to IN at times t7 to t12. Thus, the same explanation of operations is applicable by exchanging the second conducting member 102 and the second conducting member 102b. Considering the case where the voltage of each state is applied to each input of the quantum logic device according to the foregoing operations, it is understood that the quantum logic device having an input/output configuration of FIG. 8 performs operations of a truth table shown in FIG. 11.

That is, it is understood that the quantum logic device having the input/output configuration of FIG. 8 acts as a latch circuit.

FIG. 12 shows a device schematic diagram and a truth table indicating that a quantum logic device similar to that of FIG. 8 has a different input/output configuration. ORIN is inputted instead of IN of FIG. 8, IN1 is inputted instead of Φ, and IN2 is inputted instead of the Φ bar. ORIN is a signal of "1 V" which is applied earlier than Φ, e.g., in synchronization with a clock CLK. "1 V" is variable as described above. As indicated in the truth table, the device of FIG. 12 obtains an OR logic. The operations of the quantum logic device having the input/output configuration are evident from the above description.

FIG. 13 shows a device schematic diagram and a truth table indicating that a quantum logic device similar to that of FIG. 8 has still another input/output configuration. ANDIN is inputted instead of IN of FIG. 8, IN1 is inputted instead of Φ, and IN2 is inputted instead of the Φ bar. ANDIN is a signal of "0 V" which is applied earlier than Φ, e.g., in synchronization with the clock CLK. "0 V" is variable as described above. As indicated in the truth table, the device of FIG. 13 obtains an AND logic. The operations of the quantum logic device having the input/output configuration are also evident from the above description.

As described above, the logic circuits of latch, AND, and OR can be configured by changing the input/output configuration in the quantum logic device of the present embodiment. Further, the quantum logic device shown in FIG. 5 includes two quantum logic devices which can constitute the logic circuits of latch, AND, and OR. A NOT logic can be readily implemented by causing the two quantum logic devices to perform differential operations in a complementary manner. That is, as shown in FIG. 14, the NOT logic can be readily implemented by causing the input IN and an inverse signal IN bar intersect each other to produce an output OUT and an OUT bar.

When a circuit is configured thus in a differential mode, the logic circuits AND and OR of the quantum logic device and the NOT logic of the complementary circuit configuration are implemented, achieving a basic logic circuit which can constitute a given logic circuit. Thus, a given logic can be configured using a combinational logic circuit of the basic logic circuits. Moreover, a given sequential circuit can be implemented using the latch circuit composed of the quantum logic devices. That is, it is possible to achieve a system consistent with the implementation of a classical computers using existing sequential circuits.

FIG. 15 shows an example of a logic circuit when the quantum logic device of the present embodiment is applied to a circuit configuration in a differential mode. The circuit of FIG. 15 is configured to obtain a logic of OUT=NOT(IN1) AND IN2. As is evident from FIG. 15, a charge supplied as an input is used as an output in logic circuits of AND, OR, and NOT. In other words, when the logic circuits of AND, OR, and NOT are configured using the quantum logic device of the present embodiment, an inputted charge can be reused (charge recycling) in the logic circuit of the subsequent stage, thereby reducing power consumption. Charge recycling can be used over two or more stages as long as a sufficient energy can be obtained as an input. When energy needs to be supplied to the circuit, a latch circuit may be used.

The quantum logic device of the present embodiment has the circuit configuration of the differential mode, so that stability increases against a disturbance factor such as noise from a common line. Another advantage is that the NOT circuit can be implemented with great ease as described above. However, the differential mode circuit configuration is not always necessary. In this case, another device is necessary to obtain a NOT logic. An example of such a quantum logic device is the device and circuit configuration of FIG. 16. In the quantum logic device of FIG. 16, the third conduction area is divided into two areas 103a and 103b. A NOT logic circuit is obtained using the two logic devices. The input/output connection and configuration are shown in FIG. 16. When an input IN has "0", NDR of the upper device is turned on and "1" appears as an output. Conversely, when an input IN has "1", NDR of the lower device is turned on and "0" appears as an output. By using the quantum logic device for obtaining such a NOT circuit, a logic circuit does not have to be configured in the differential mode, thereby halving the number of signals.

A known method of forming a thin film, lithography, and etching are applicable for manufacturing the quantum logic device of the present embodiment. The quantum logic device can be manufactured by properly combining the known thin-film forming and processing methods. In the quantum logic device, manufacturing processes requiring the finest forming and processing techniques are a process of forming a thin film serving as the first conducting member, a process of forming a thin film serving as the insulating member 104, and a process of forming a thin film serving as the second conducting member. Even in a cutting-edge process technology, film formation and micromachining of several nm have difficulties particularly in the process of lithography and etching. However, a thin film on the order of several nm can be formed with relative ease by using molecular beam epitaxy and MO-CVD, so that the quantum logic device can be manufactured using these methods of forming thin films.

The present invention was specifically described in accordance with the embodiment. The present invention is not limited to the embodiment and changes may be made without departing from the scope of the present invention.

For example, the embodiment described the quantum well (QW) for generating 2DGE, as a quantum structure area to be quantized. A requirement of the quantum structure area of the present invention is quantization in one direction (z direction in the present embodiment) and quantization may be performed in x direction or both in x direction and y direction.

INDUSTRIAL APPLICABILITY

The present invention relates to a quantum logic device and a logic circuit which can be implemented in a system consistent with the implementation of a classical computer. The present invention can be used in an information processing industry such as computer industry.

BRIEF DESCRIPTION OF THE DRAWINGS

FIG. 1 is an energy band diagram of an isolated QW;

FIG. 2 is an energy band diagram showing a state of a coupled quantum well;

FIG. 3 is a graph showing I-V characteristics expected between coupled quantum wells;

FIG. 4 is an equivalent circuit which is a model of a quantum device of the present invention;

FIG. 5 is a perspective view showing an example of a quantum logic device according to an embodiment of the present invention;

FIG. 6 is a sectional view taken along line A-A of FIG. 5;

FIG. 7 is a sectional view taken along line B-B of FIG. 5;

FIG. 8 schematically shows a quantum logic device;

FIG. 9 is a circuit diagram showing the equivalent circuit of the quantum logic device of FIG. 8;

FIG. 10 is a diagram for explaining the operations of the quantum logic device of FIG. 8;

FIG. 10(a) is a time chart;

FIG. 10(b) is a band diagram;

FIG. 10(c) is an I-V characteristic diagram;

FIG. 11 is a circuit diagram showing the equivalent circuit of the quantum logic device of FIG. 8;

FIG. 12 shows a device schematic diagram and a truth table indicating that a quantum logic device similar to that of FIG. 8 has a different input/output configuration;

FIG. 13 shows a device schematic diagram and a truth table indicating that a quantum logic device similar to that of FIG. 8 has still another input/output configuration;

FIG. 14 shows an example of the implementation of an AND circuit in a logic circuit having a complementary configuration;

FIG. 15 shows an example of a logic circuit when the quantum logic device serving as an embodiment of the present invention is applied to a complementary circuit configuration, and FIG. 16 is a diagram schematically showing an example of another quantum logic device.

The invention claimed is:

1. A quantum device, in a real space where a given first direction is defined, comprising:
   a first quantum structure area and a second quantum structure area, the areas confining a carrier at least in the first direction,
   a tunnel barrier area between the first quantum structure area and the second quantum structure area,
   a first electrode area for injecting a carrier into the first quantum structure area from a direction not disturbing a quantum confined state in the first direction of the first quantum structure area, the direction being parallel to a plane perpendicular to the first direction, a second electrode area for injecting a carrier into the second quantum structure area from a direction not disturbing a quantum confined state in the first direction of the second quantum structure area, the direction being parallel to a plane perpendicular to the first direction, a carrier conduction area, and an isolation area arranged between the first quantum structure area and the carrier conduction area, such that a voltage applied to the carrier conduction area changes I-V characteristics between the first electrode area and the second electrode area.

2. The quantum device according to claim 1, wherein the first quantum structure area and the second quantum structure area are a quantum well, quantum wire, or quantum dot for confining a carrier at least in the first direction.

3. The quantum device according to claim 1, wherein the carrier conduction area is arranged on a position or in a shape such that an electric field generated by a potential applied to the carrier conduction area has a greater influence on an electrostatic potential of the first quantum structure area as compared with an electrostatic potential of the second quantum structure area.

4. The quantum device according to claim 1, wherein a subband level of the first quantum structure area is controlled by an electric field generated by the carrier conduction area, the subband level being generated by confining a carrier in the first quantum structure area, and a Fermi level of the carrier of the first quantum structure area is controlled by a potential applied to the first electrode area or a potential applied to the second electrode area when the first quantum structure area and the second quantum structure area are resonantly coupled.

5. The quantum device according to claim 1, further comprising:

a positive differential resistance state appearing due to a tunnel effect of a resonant coupling between the first quantum structure area and the second quantum structure area, the resonant coupling occurring between state functions of energy levels of the first quantum structure area and the second quantum structure area due to a potential difference between the first quantum structure area and the second quantum structure area, a negative differential resistance state appearing between the first quantum structure area and the second quantum structure area due to an overlap of the state functions of the energy levels spreading to the tunnel barrier area, though a resonant coupling is absent or is disappearing, and an isolation state between the first quantum structure area and the second quantum structure area, the isolation state having no resonant coupling or overlap of the state functions or having a negligible overlap of the state functions.

6. The quantum device according to claim 1, further comprising a positive differential resistance area which has a positive correlation between a voltage and a current as a voltage difference between the first electrode area and the second electrode area has a larger absolute value in a current-voltage characteristic between the first electrode area and the second electrode area, a negative differential resistance area having a negative correlation between a voltage and a current, and an isolation area where no current is applied or a current equal to or 10% lower than a current peak value is applied even when a voltage increases in absolute value.

7. The quantum device according to claim 1, wherein a plurality of second quantum structure areas are formed on a plane perpendicular to the first direction.

8. The quantum device according to claim 1, wherein a plurality of first quantum structure areas are formed on a plane perpendicular to the first direction and a plurality of second quantum structure areas are formed on another plane perpendicular to the first direction.

9. The quantum device according to claim 1, wherein a plurality of carrier conduction areas are formed and different potentials are applied to the plurality of carrier conduction areas.

10. The quantum device according to claim 1, further comprising a logic circuit driving system, wherein a carrier signal is applied to the carrier conduction area in synchronization with a first clock signal and an electrode signal is applied to the second electrode area in synchronization with a second clock signal delayed from the clock signal by a predetermined phase such that an equalizing period for equalizing potentials of the first quantum structure area, the second quantum structure area, and the carrier conduction area from the time the electrode signal is applied to the second electrode area until the time the carrier signal is applied to the carrier conduction area.

11. A quantum logic device using a quantum device, the quantum device, in a real space where a given first direction is defined, comprising:

a first quantum structure area and a pair of second quantum structure areas, the areas confining a carrier at least in the first direction, a tunnel barrier area between the first quantum structure area and the pair of second quantum structure areas, a first electrode area for injecting a carrier into the first quantum structure area from a direction not disturbing a quantum confined state in the first direction of the first quantum structure area, the direction being parallel to a plane perpendicular to the first direction, a pair of second electrode areas for injecting a carrier into the pair of second quantum structure areas from a direction not disturbing a quantum confined state in the first direction of the second quantum structure area, the direction being parallel to a plane perpendicular to the first direction, a carrier conduction area, and an isolation area arranged between the first quantum structure area and the carrier conduction area, such that a voltage applied to the carrier conduction area changes I-V characteristics between the first electrode area and the second electrode area, wherein the quantum logic device constituting at least one of a latch circuit, an OR logic circuit, and an AND logic circuit, wherein:

in the latch circuit the carrier conduction area serves as an input, the first electrode area serves as an output, one of the second electrode areas is in "1" state (high voltage state), and the other second electrode area is in "0" state (low voltage state), in the OR logic circuit the pair of second electrode areas serve as inputs, the first electrode area serves as an output, and the carrier conduction area is in "1" state (high voltage state), in the AND logic circuit the pair of second electrode areas serve as inputs, the first electrode area serves as an output, and the carrier conduction area is in "0" state (low voltage state).

12. The quantum logic device according to claim 11, wherein the first quantum structure area and the second quantum structure area are a quantum well, quantum wire, or quantum dot for confining a carrier at least in the first direction.

13. The quantum logic device according to claim 11, wherein the carrier conduction area is arranged on a position or in a shape such that an electric field generated by a potential applied to the carrier conduction area has a greater influence on an electrostatic potential of the first area structure area as compared with an electrostatic potential of the second quantum structure area.

14. The quantum logic device according to claim 11, wherein an energy subband level of the first quantum structure area is controlled by an electric field generated by the carrier conduction area, the energy subband level being generated by confining a carrier in the first quantum structure area, and
a Fermi level of the carrier of the first quantum structure area is controlled by a potential applied to the first electrode area or a potential applied to the second electrode area when the first quantum structure area and the second quantum structure area are resonantly coupled.

15. The quantum logic device according to claim 11, further comprising:
a positive differential resistance state appearing due to a tunnel effect of a resonant coupling between the first quantum structure area and the second quantum structure area, the resonant coupling occurring between state functions of energy levels of the first quantum structure area and the second quantum structure area due to a potential difference between the first quantum structure area and the second quantum structure area,
a negative differential resistance state appearing between the first quantum structure area and the second quantum structure area due to an overlap of the state functions of the energy levels spreading to the tunnel barrier area, though a resonant coupling is absent or is disappearing, and
an isolation state between the first quantum structure area and the second quantum structure area, the isolation state having no resonant coupling or overlap of the state functions or having a negligible overlap of the state functions.

16. The quantum logic device according to claim 11, further comprising a positive differential resistance area which has a positive correlation between a voltage and a current as a voltage difference between the first electrode area and the second electrode area has a larger absolute value in a current-voltage characteristic between the first electrode area and the second electrode area, a negative differential resistance area having a negative correlation between a voltage and a current, and an isolation area where no current is applied or a current equal to or 10% lower than a current peak value is applied even when a voltage increases in absolute value.

17. A logic circuit driving system of a quantum logic device according to claim 11, wherein a signal is applied to the carrier conduction area in synchronization with a first clock signal and a signal is applied to the second electrode area in synchronization with a second clock signal delayed from the clock signal by a predetermined phase.

18. The logic circuit driving system of the quantum logic device according to claim 17, further comprising an equalizing period for equalizing potentials of the first quantum structure area, the second quantum structure area, and the carrier conduction area from the time a signal is applied to the second electrode area until the time a signal is applied to the carrier conduction area.

19. The quantum logic device according to claim 17, wherein the first clock signal and the second signal are separately applied to a plurality of latch circuits when the plurality of latch circuits are included in a logic circuit constituted of the quantum logic device including a circuit having a cascade connection of:
a combinational logic circuit configured by arbitrarily combining the AND circuit, the OR circuit, or the NOT circuit in the quantum logic device,
a combinational logic circuit configured by arbitrarily combining the AND circuit or the OR circuit when the logic circuit is driven in a differential mode in which an input signal and an inverted input signal are inputted and an output signal and an inverted output signal are outputted in the logic circuit configured by arbitrarily combining the quantum logic device, or arbitrarily combining a NOT logic configured by inverting and outputting the input signal in the differential mode, and
a latch circuit in the quantum logic device.

20. The quantum logic device according to claim 11, wherein in driving of a logic circuit configured by arbitrarily combining the quantum logic device, the logic circuit is driven in a differential mode in which an input signal and an inverted input signal are inputted and an output signal and an inverted output signal are outputted.

21. The quantum logic device according to claim 20, further comprising a NOT circuit is configured by inverting and outputting the input signal in the differential mode.

22. A quantum logic device according to claim 21, including a combinational logic circuit configured by arbitrarily combining the AND circuit, the OR circuit, or the NOT circuit.

23. A quantum logic device according to claim 11, including a combinational logic circuit configured by arbitrarily combining an AND circuit or an OR circuit when the logic circuit is driven in a differential mode in which an input signal and an inverted input signal are inputted and an output signal and an inverted output signal are outputted in the logic circuit configured by arbitrarily combining the quantum logic device, or arbitrarily combining a NOT logic configured by inverting and outputting the input signal in the differential mode.

24. A quantum logic device according to claim 11 including a cascade connection of:
a combinational logic circuit configured by arbitrarily combining the AND circuit, the OR circuit, or the NOT circuit in the quantum logic device,
a combinational logic circuit configured by arbitrarily combining the AND circuit or the OR circuit when the logic circuit is driven in a differential mode in which an input signal and an inverted input signal are inputted and an output signal and an inverted output signal are outputted in the logic circuit configured by arbitrarily combining the quantum logic device, or arbitrarily combining a NOT logic configured by inverting and outputting the input signal in the differential mode, and
a latch circuit in the quantum logic device.

25. A quantum logic device using a quantum device, the quantum device, in a real space where a given first direction is defined, comprising:
a first quantum structure area and a second quantum structure area, the areas confining a carrier at least in the first direction,
a tunnel barrier area between the first quantum structure area and the second quantum structure area,
a first electrode area for injecting a carrier into the first quantum structure area from a direction not disturbing a quantum confined state in the first direction of the first quantum structure area, the direction being parallel to a plane perpendicular to the first direction, a second electrode area for injecting a carrier into the second quantum structure area from a direction not disturbing a quantum confined state in the first direction of the second quantum structure area, the direction being parallel to a plane perpendicular to the first direction, a pair of carrier conduction areas, and an isolation area arranged between the first quantum structure area and the pair of carrier conduction areas, the quantum logic device constituting a NOT logic circuit in which the two quantum devices are used, on condition that one of the two quantum devices acts as a first device and the other acts as a second device, one of the carrier conduction areas of the first device and one of the carrier conduction areas of the second device serve as inputs, the first electrode area of the first device and the first electrode area of the second device serve as outputs, the other carrier conduction area of the first device and the second electrode area of the first device are in "1" state (high voltage state), and the other carrier conduction area of the second device and the second electrode area of the second device are in "0" state (low voltage state).

26. The quantum device according to claim 25, further comprising a logic circuit driving system, wherein a carrier signal is applied to the carrier conduction areas in synchronization with a first clock signal and an electrode signal is applied to the second electrode area in synchronization with a second clock signal delayed from the clock signal by a predetermined phase such that an equalizing period for equalizing potentials of the first quantum structure area, the second quantum structure area, and the carrier conduction area from the time the electrode signal is applied to the second electrode area until the time the carrier signal is applied to the carrier conduction areas.

* * * * *